United States Patent [19]

Nakanishi et al.

[11] Patent Number: 4,954,877
[45] Date of Patent: Sep. 4, 1990

[54] CHIP CARRIER

[75] Inventors: Keiichirou Nakanishi, Kokubunji; Minoru Yamada, Hanno; Masakazu Yamamoto, Kodaira; Satoru Ogihara; Hiroichi Shinohara, both of Hitachi; Hideo Suzuki, Katsuta, all of Japan

[73] Assignee: Hitachi, Ltd., Tokyo, Japan

[21] Appl. No.: 388,071

[22] Filed: Aug. 2, 1989

[30] Foreign Application Priority Data

Sep. 7, 1988 [JP] Japan ................. 63-222316

[51] Int. Cl.⁵ .......................................... H01L 39/02
[52] U.S. Cl. ................................... 357/80; 357/68; 357/65
[58] Field of Search ........................ 357/80, 68, 65

[56] References Cited

U.S. PATENT DOCUMENTS

| 3,968,193 | 7/1976 | Langston, Jr. et al. | 357/68 |
| 4,082,394 | 4/1978 | Gedney et al. | 357/80 |
| 4,221,047 | 9/1980 | Narken et al. | 357/68 |
| 4,407,007 | 9/1983 | Desai et al. | 357/80 |
| 4,649,417 | 3/1987 | Burgess et al. | 357/74 |

Primary Examiner—Rolf Hille
Assistant Examiner—Hoanganh Le
Attorney, Agent, or Firm—Antonelli, Terry, Stout & Kraus

[57] ABSTRACT

The present invention relates to a chip carrier, on which LSI chips are mounted and a chip carrier is disclosed, in which a region where power source throughholes are arranged and a region where signal throughholes are arranged are separated from each other and a coupling capacitor is formed only in the region where the power source throughholes are arranged with an intention to reduce noise.

11 Claims, 7 Drawing Sheets

F I G. 2
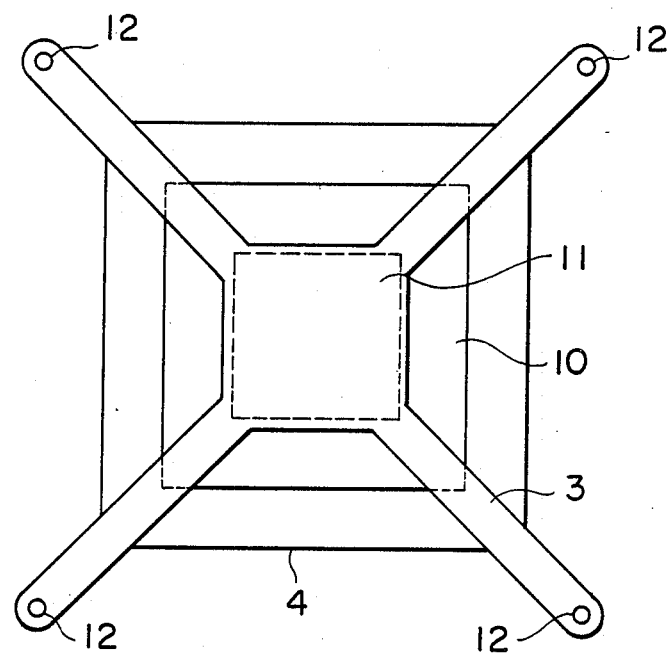

CHIP CARRIER

BACKGROUND OF THE INVENTION

The present invention relates to a chip carrier, on which LSI chips are mounted, and in particular to a chip carrier suitable for a large scale information processing unit such as an electronic computer, etc., to which a high signal propagation velocity is required.

In order to drive LSI chips with a high reliability, it is necessary to seal the chips against external atmosphere to prevent the penetration of humidity, etc. For this reason a so-called chip carrier is widely used.

Further, with the intention of increasing the operation speed in an electronic computer, etc., it is necessary to package LSI chips having a high circuit density and many pins with a high density. Consequently it is desirable that the chip carriers, on which LSI chips are to be mounted, are also small and that a number of signal pins can be taken out therefrom, and further it is necessary to package a number of chip carriers on a multilayered wiring board. FIG. 6 shows an example of such a chip carrier, which is small and from which a number of pins can be taken out, which is proposed in JP-A No. 60-217649. In the figure reference numeral 1 is an LSI chip; 2 is a throughhole for in/outputting electric power and signals; 4 is a subboard; 7 is a cap; and 6' is a terminal pad. The terminal pads 6' are arranged two-dimensionally on the lower surface of the chip carrier.

On the other hand, with increasing circuit density of the LSI chip, the number of circuits, in which the logical state is switched simultaneously increases, which gives rise to a problem that so-called noise accompanying simultaneous switching is produced. In order to reduce this noise, it is common to mount e.g. a decoupling capacitor between a wire at the power source potential and a wire at the ground potential on the wiring board.

In this case, when the decoupling capacitor is mounted on the surface of the wiring board, it becomes necessary to extend the wiring from the capacitor to a point, where it is desired originally to connect the capacitor, which gives rise to a problem that the decoupling effect is reduced by the inductance of this connecting wire.

As a technique for solving the problematical point described above by reducing the length of the wire for connecting the capacitor, e.g. the followings are proposed. JP-A No. 58-111396 discloses a technique, by which a capacitor is located within the wiring board; JP-A No. 62-169461 shows an example, in which a capacitor is formed in a part of the package of a semiconductor device; and JP-A No. 61-247058 describes an example, by which a capacitor is incorporated in the upper portion (cap portion) of the chip carrier.

SUMMARY OF THE INVENTION

In order to reduce the simultaneous switching noise described above, it is the most desirable to locate a decoupling capacitor in the neighborhood of the pole of the LSI chip, where switching takes place. Consequently, in order to shorten further the wire for connecting the capacitor, it is ideal to locate the capacitor most closely to the LSI chip within the chip carrier.

However, when the capacitor is incorporated within the chip carrier having a number of terminal pads, as indicated in FIG. 6, it is not appropriate to apply the technique disclosed in JP-A No. 58-111396, by which the capacitor is incorporated within the wiring board, as it is. This is due to the fact that since according to JP-A No. 58-111396 a conductive material 14a for a lower electrode, a high dielectric constant material 3 and a conductive material 14b for an upper electrode are applied in this order by the screen printing on a green sheet of the wiring board 13 and the capacitor is formed between a power throughhole 2b at the power source potential and the power source throughhole 2b' at the ground potential, as indicated in FIG. 7, if this is applied to the chip carrier as indicated in FIG. 6, the high dielectric constant material 3 for forming the capacitor is brought electrically into contact with a throughhole 2a, through which electric signals are to be transmitted. In this way the electric signals are propagated in a region, where the dielectric constant is high, which gives rise to a significant delay. Further, in JP-A No. 63-77141 there is disclosed an example, in which the capacitor is formed between two terminal pads on the lower surface of the package of the LSI. However, in this example also no attention was paid to lowering of the capacity of signal terminal pads, which should transmit electric signal.

The object of this invention is to provide a chip carrier incorporating a capacitor having a significant noise reducing effect, in which it is possible to take out signals through a number of terminal pads, without accompanying lowering of the signal propagation velocity.

The object described above can be achieved by providing a structure, in which the high dielectric constant material for the decoupling capacitor and the signal throughholes within the chip carrier are not in contact with each other.

That is, it can be achieved by a structure, in which the region, where the signal throughholes within the chip carrier are located, is separated from the region, where the power throughholes are located, and the high dielectric constant material is disposed only in the region, where the power throughholes are located.

Such a structure is efficient in a chip carrier, in which the wiring board is relatively thin (about 1 mm thick) and one subboard corresponds to one LSI chip, and thus it is not appropriate to apply it to a wiring board. This is due to the fact that since the wiring is multilayered, the wiring board is thick (5 to 10 mm) and since the throughhole is long, it is necessary that the power throughholes and the signal throughholes are mixed to reduce cross-talk between the signal throughholes. Further, in the case where a plurality of LSI chips are mounted on the wiring board, it is not desirable in practice to locate all the signal throughholes at the peripheral portion of the board and all the power throughholes at the central portion of the board.

BRIEF DESCRIPTION OF THE DRAWINGS

FIG. 2 is a plan view indicating the relation between a sheet made of a dielectric substance and a throughhole region used for realizing the present invention;

DESCRIPTION OF THE PREFERRED EMBODIMENTS

Embodiment

In the chip carrier according to this embodiment the signal throughholes within the chip carrier are separated from the power throughholes and the decoupling capacitor is so constructed that only the power source throughholes are in contact with the high dielectric constant material. Here an example is shown, where the signal throughholes and the power source throughholes within in the chip carrier are gathered in the peripheral portion and the central portion, respectively, and the high dielectric constant material is disposed only in the central portion to constitute the decoupling capacitor.

Figure 1A:
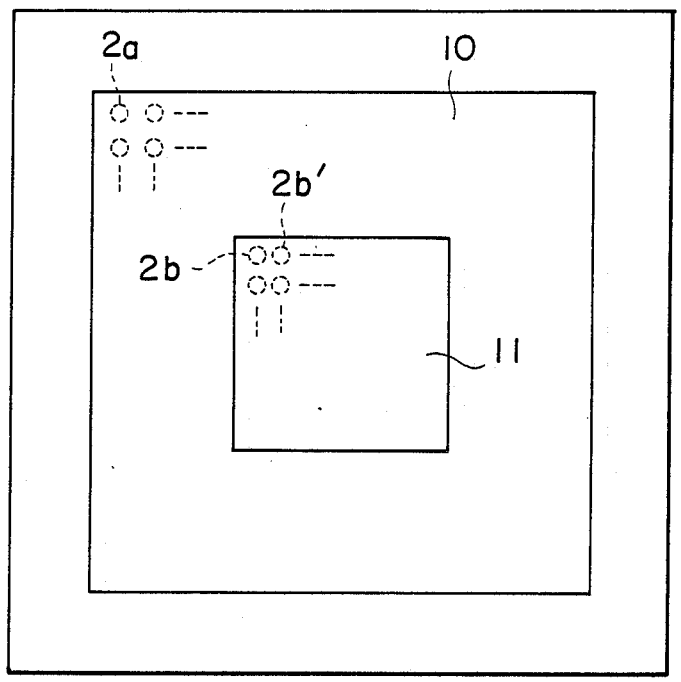
FIGS. 1a and 1b are a plan view and a crosssectional view illustrating a chip carrier according to the present invention.
Figure 1B:
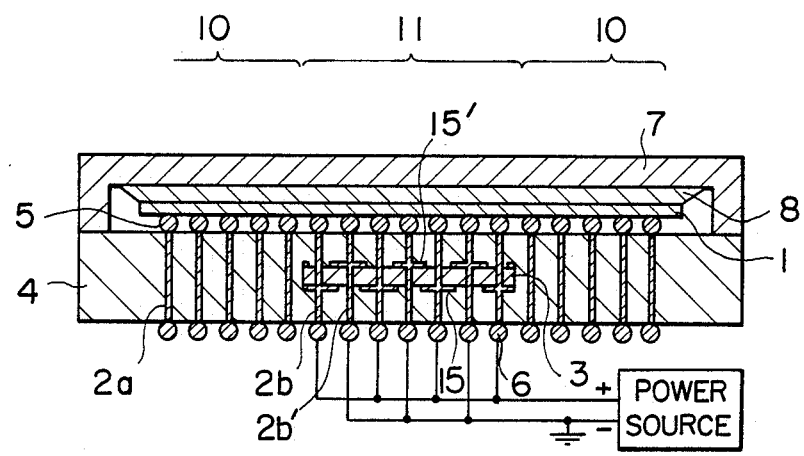

FIGS. 1a and 1b are a plan view and a cross-sectional view, respectively, illustrating a first embodiment of the present invention. Within a subboard 4 there are disposed a signal throughhole arranging region 10, where signal throughholes 2a are disposed, and a power throughhole arranging region 11, where signal throughholes 2b and 2b' are disposed. Further a sheet-shaped high dielectric constant material is disposed only in the central portion. The subboard 4 has a size of 12 mm×12 mm and a thickness of 1 mm. The diameter of the throughholes is 100 μm and the pitch thereof is 260 μm. These are same for the signal throughholes 2a and for the power through-holes 2b, 2b'. The number of the signal throughholes and the power throughholes all together is about 1500. The high dielectric constant material 3 is 30 μm thick. On both the surfaces of this sheet-shaped high dielectric constant material 3 there are formed electrodes 15 and 15', which are connected with a power source throughhole at the power source potential 2b and a throughhole at the ground potential 2b', respectively. The decoupling capacitor is formed by these electrodes 15 and 15' and the high dielectric constant material 3 disposed therebetween.

Substances used for the various parts are as follows. Alumina ceramic, mulite ceramic and glass ceramic can be used for the subboard 4. As the composition of the glass ceramic, $Li_2O.Al_2O_3.SiO_2$ glass, mixture of $SiO_2$ and $MgO.CaO.Al_2O_3.B_2O_3$ glass as well as mixture of $Al_2O_3$ and $SiO_2.B_2O_3.K_2O.ZnO$ glass and the like can be applied thereto. As conductive materials used for the throughholes and the electrodes, can be used wolfram or molybdenum for alumina or mulite ceramic and copper or silber-palladium alloy for glass ceramic. As the high dielectric constant material, $Pb(Fe.W).PbTiO_3.Pb(FeNb)$, $Pb(Mg_{166}Nb_{\frac{1}{3}})O_3.PbTiO_3$, $Pb(Fe_{166}W_{178})O_3.Pb(Fe_{178}Nb_{178})O_3.PbTiO_3$, $BaTiO_3$, and the like can be applied thereto.

Further, on the surface of a subboard 4, an LSI chip 1 having a size of 10 mm×10 mm is electrically connected by a fine solder sphere 5. This LSI chip 1 is sealed by the subboard 4 and a cap 7 with respect to the exterior. The LSI chip 1 and the cap 7 are jointed by solder 8 so that heat produced in the LSI chip 1 is transferred to the upper surface of the cap through the solder 8 and evacuated through a cooling fin (not indicated in the figure) disposed on the upper surface of the cap 7.

Further solder terminals 6 are disposed two-dimensionally on the lower surface of the subboard and connection with a wiring board (not shown in the figure) is made by means of these solder terminals.

Figures 5A, 5B:
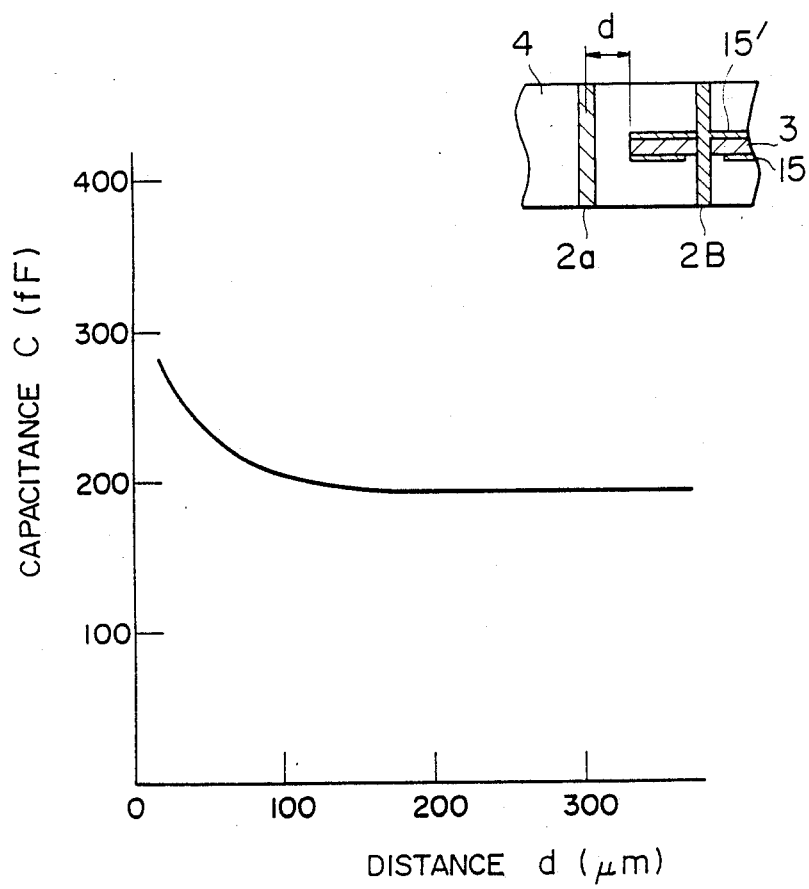
FIG. 5 is a graph showing the relation between the effect to reduce the capacity and the distance between the signal throughhole and the high dielectric constant material.
Figure 5:
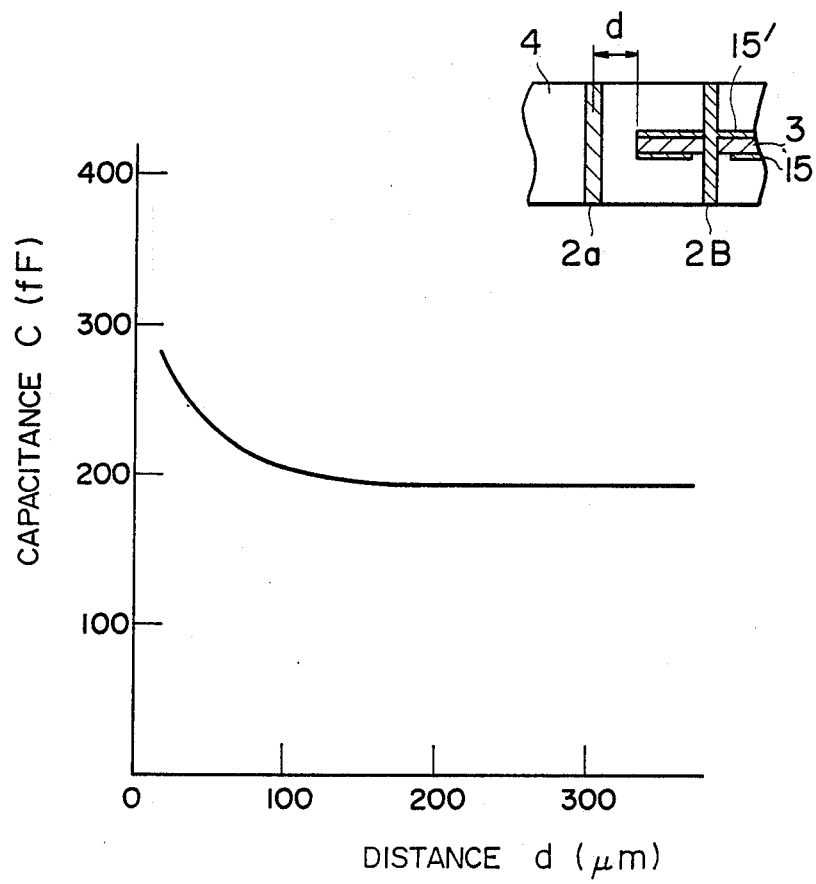

FIG. 5 indicates the propagation time of signals passing through the throughhole 2a with respect to the value of the capacitance thereof, in the case where the high dielectric constant material 3 and the power throughholes 2B are located, separated from the signal throughhole 2a. The abscissa represents the distance d from the high dielectric constant material 3 to the signal throughhole 2a and the ordinate indicates the value of the capacitance of a signal throughhole 2a. The value of the capacitance increases rapidly with decreasing distance d so that the signal propagation time of the signal passing through the throughhole increases rapidly. On the contrary, for the distance d greater than about 100μm, the value of the capacitance remains stably to be about 200 pF and therefore it is not disadvantageous to the propagation of the signal.

Consequently the signal throughholes and the high dielectric constant material may be located so that the distance between the signal throughhole closest to the high dielectric constant material among them and the high dielectric constant material is greater than 100 μm.

In order to dispose the high dielectric constant material only in a part of the chip carrier, it is necessary to position accurately the high dielectric constant material. This is done by the method, by which the sheet of the high dielectric constant material is processed so as to form a bandshaped portion extending from the central power throughhole region to a positioning guide pin at the peripheral portion, or by the method, by which the high dielectric constant material is buried in the sheet made of a low dielectric constant material.

Here, as an example, the former method will be described, by which a chip carrier incorporating the capacitor is fabricated by using a sheet made of a high dielectric constant material and having a bandshaped portion extending from the central power source throughhole to the positioning guide pin at the peripheral portion. At first a bonding agent and solvent are added to a mixture of powder of alumina, mulite, glass, etc. with talc, etc. After having admixed them by means of a ball mill, the mixture is extended in a plate shape on an insulating sheet and dried to obtain a green sheet. Holes are formed at predetermined positions in this green sheet by drill or punch. Conductive paste obtained by mixing powder of wolfram molybdenum, copper, silber-palladium, etc. in the bonding agent and the solvent is injected in the holes by the screen printing method to form throughholes. Electrodes are formed by the screen printing method using the conductive paste described above on the green sheet having these throughholes. At this time positioning guide holes are formed in the peripheral portion of the green sheet by drill or punch. By a method similar to that described above a green sheet is fabricated by using powder of the high dielectric constant material. However the throughholes and the guide holes are formed but no electrodes are formed. Further this green sheet is cut in a shape indicated by 3 in FIG. 2. Next, by means of a jig having guide pins these green sheets are positioned with respect to each other by inserting the guide pins in the guide holes. Three green sheets are superposed on each other in the order of a green sheet made of alumina, mulite or glass, a green sheet made of the high dielectric constant material and a green sheet made of alumina, mulite or glass. At this time the two green sheets made of alumina, mulite or glass should be superposed, putting the green sheet made of the high dielectric constant material therebetween, so that the surfaces, on which the electrodes are formed, are opposite to each other. After the termination of the superposition, the chip carrier incorporating a capacitor, as indicated in FIG. 1b, is fabricated by hot press and sintering. The above fabricating method is particularly described in U.S. Pat. No. 276,029 (titled "Condenser-Containing, Ceramic Multi-layer Circuit Board and Semiconductor Module and Computer Having the Circuit Board" filed on Nov. 25, 1988) which was proposed by some of the present inventors.

FIG. 2 is a plan view indicating the relation between the dielectric sheet and the throughhole region in the present embodiment fabricated by the method described above. The sheet-shaped high dielectric constant material 3 covers completely the power through-hole arranging region 11 of the subboard 4 and it covers a part of the signal throughhole arranging region 10 with a narrow-band-shaped part thereof. This band-shaped part is connected with the guide pins 12 for positioning the sheet 3 made of the high dielectric constant material. By using such a sheet made of the high dielectric constant material, it is possible to keep the number of signal throughholes having a large capacity as small as possible and to effect the positioning of the high dielectric constant material in a simple manner.

Embodiment 2

Figure 3:
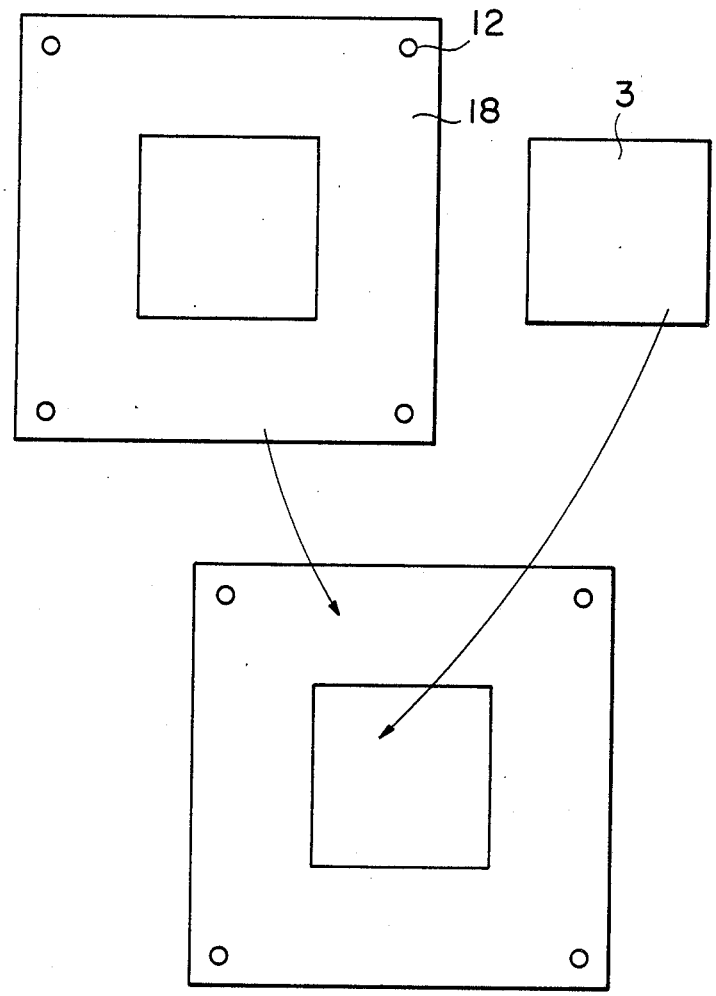
FIG. 3 is a plan view showing a sheet made of a dielectric substance used in another chip carrier according to the present invention.

FIG. 3 is a plan view of a sheet made of the high dielectric constant material used in another embodiment of the present invention. In the present embodiment a sheet 3 made of the high dielectric constant material is buried in the central portion of a low dielectric constant material sheet 18. Since the two sheets are made in one body, it is possible to position easily the sheet on the subboard by inserting guide pins 12 in guide holes formed in the peripheral portion of the low dielectric constant material sheet 18. As the low dielectric constant material, alumina ceramic, mulite ceramic, glass ceramic, etc., i.e. those indicated in the first embodiment as the constituent material for the subboard, can be used. The other construction in this embodiment is identical to that indicated in FIG. 1b and it can be fabricated in the same way as in Embodiment 1.

Embodiment 3

Figure 4A:
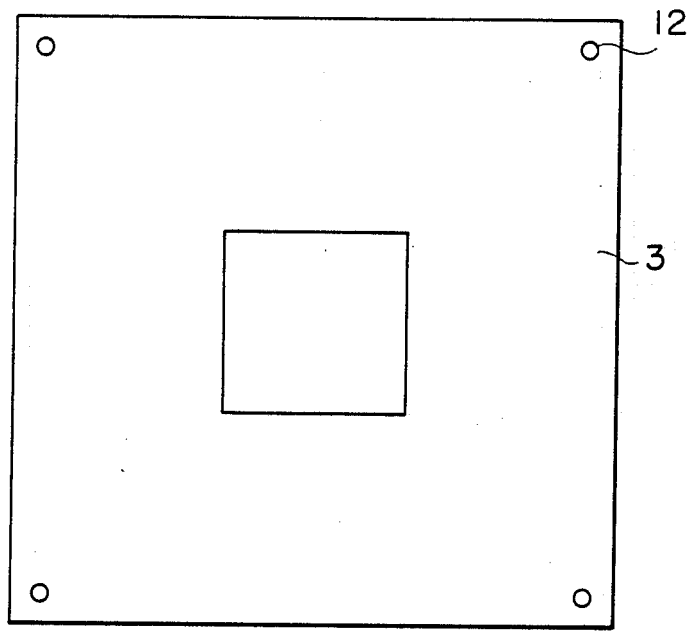
FIGS. 4a and 4b are a plan view and a cross-sectional view illustrating still another chip carrier according to the present invention.
Figure 4B:
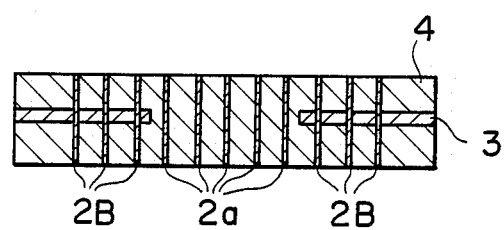
Figure 6:
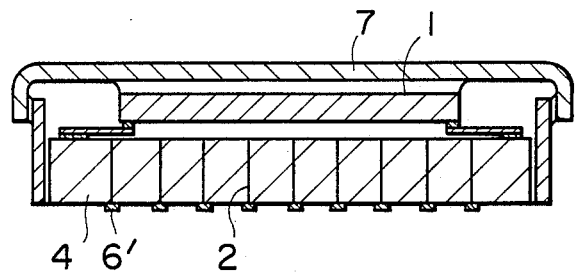
FIG. 6 is a plan view illustrating a prior art chip carrier.
Figure 7:
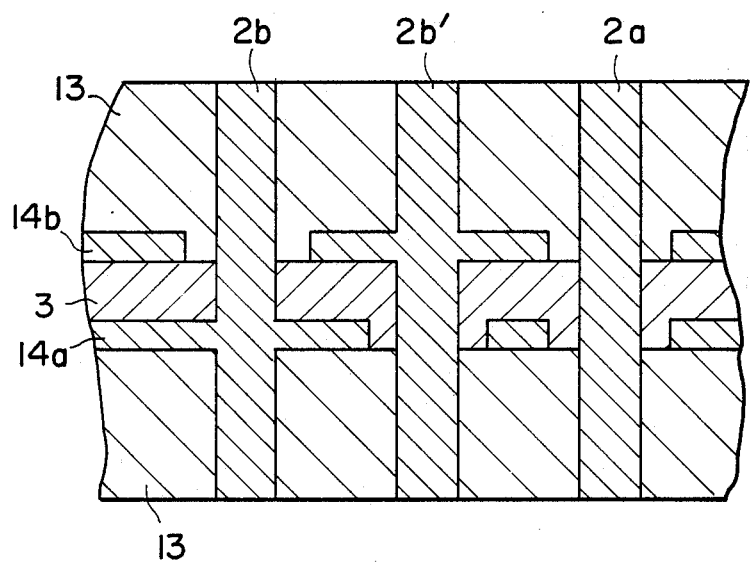
FIG. 7 is a cross-sectional view illustrating a prior art wiring board.

Still another embodiment of the present invention will be explained below. FIG. 4a is a plan view of a high dielectric constant material sheet used in this embodiment and FIG. 4b is a cross-sectional view of a subboard in this embodiment. The other construction is identical to that indicated in FIG. 1b.

In this embodiment, as indicated in FIG. 4b, signal throughholes 2a are disposed in the central portion of the subboard 4 and power throughholes 2B are formed in the peripheral portion thereof. That is, the positions of the signal throughholes and the power throughholes are reversed with respect to those indicated in the first and the second embodiment. In this embodiment, as indicated in the first and the second embodiment, no special idea is necessary for realizing the positioning of the high dielectric constant material sheet 3 and it is sufficient to form guide holes in the peripheral portion of the high dielectric constant material 3, as indicated in FIG. 4a.

According to the present invention, since it is possible to form the decoupling capacitor within the cap carrier without increasing the capacity of the signal through-hole, it is possible to realize a lower noise and a higher signal propagation velocity than those obtained by the prior art techniques.

What is claimed is:

1. A chip carrier comprising:
   a subboard;
   at least one LSI chip disposed on said subboard;
   signal through-holes disposed only on a first region of said subboard for inputting/outputting signals in/-from said chip;
   power through-holes disposed only on a second region of said subboard for supplying electric power to said chip; and
   high dielectric constant material disposed on said second region and having a specific dielectric constant higher than that of the material constituting said subboard.

2. A chip carrier according to claim 1, wherein said high dielectric constant material is sheet-shaped and buried in said subboard so as to cover said second region.

3. A chip carrier according to claim 2, wherein a first surface of said sheet-shaped high dielectric constant material is electrically in contact with an electrode connected with a through-hole at a power source potential among said power through-holes and a second surface of said sheet-shaped high dielectric constant material is electrically in contact with an electrode connected with a through-hole at ground potential among said power through-holes.

4. A chip carrier according to claim 1, wherein said first region is a peripheral portion of said subboard and said second region is the central portion of said subboard.

5. A chip carrier according to claim 4, wherein said high dielectric constant material is sheet-shaped, which covers said second region of said subboard and a part of which traverses a part of said first region so as to be in contact with guide pins for positioning said high dielectric constant material disposed outside of said subboard.

6. A chip carrier according to claim 4, wherein said sheet-shaped high dielectric constant material is buried in a sheet having a dielectric constant lower than that of said high dielectric constant material and disposed within said subboard so as to cover said second region.

7. A chip carrier according to claim 1, wherein said first region is the central portion of said subboard and said second region is a peripheral portion of said subboard.

8. A chip carrier according to claim 1, wherein said high dielectric constant material is far from a center of said signal through-holes at least by 100 $\mu$m.

9. A chip carrier according to claim 1, wherein said high dielectric constant material is disposed only on said second region.

10. A chip carrier comprising:
    a board;
    LSI chips disposed on said board;
    a plurality of signal through-holes traversing said board and transmitting signals to said chips;
    a plurality of power through-holes traversing said board and supplying electric power to said chips; and capacitor forming members comprising a capacitor disposed between a through-hole at a power source potential and a through-hole at ground potential among said power through-holes;

wherein the distance between said capacitor forming members and a center of the signal through-hole, closest thereto is at least equal to 100 μm.

11. A chip carrier comprising:

a board;

a plurality of terminals disposed on the lower surface of said board;

signal through-holes and power through-holes connected with said plurality of terminals and disposed within said board; and LSI chips disposed on said board, signals being in-/outputted in/from said LSI chips through said signal through-holes, electric power being supplied thereto through said power through-holes;

wherein a region where said power through-holes are arranged and a region where said signal through-holes are arranged are separated from each other and a coupling capacitor is provided between a power through-hole at a power source potential and a power through-hole at ground potential.

* * * * *